United States Patent
Yu et al.

(10) Patent No.: US 8,368,186 B2
(45) Date of Patent: Feb. 5, 2013

(54) DEVICE AND METHODS FOR ELECTROSTATIC DISCHARGE PROTECTION

(75) Inventors: Ta Lee Yu, Shanghai (CN); Chi Kang Liu, Shanghai (CN); Jing Liu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 13/076,269

(22) Filed: Mar. 30, 2011

(65) Prior Publication Data

US 2012/0074539 A1    Mar. 29, 2012

(30) Foreign Application Priority Data

Apr. 2, 2010    (CN) .......................... 2010 1 0144264

(51) Int. Cl.
*H01L 23/552*    (2006.01)
(52) U.S. Cl. .................. 257/659; 257/E23.114
(58) Field of Classification Search .................. 257/659, 257/E23.114
See application file for complete search history.

(56) References Cited

U.S. PATENT DOCUMENTS

2004/0155291 A1* 8/2004 Okushima ..................... 257/355

FOREIGN PATENT DOCUMENTS

CN    1913276 A    2/2007

* cited by examiner

*Primary Examiner* — Zandra Smith
*Assistant Examiner* — Marvin Payen
(74) *Attorney, Agent, or Firm* — Kilpatrick Townsend & Stockton LLP

(57) ABSTRACT

An ESD device includes a first and second well regions disposed in a semiconductor substrate. The first well region comprises a plurality of N wells spaced at a predetermined length. A heavily doped P+ region and a heavily doped N+ region are disposed in each of the N wells. The heavily doped N+ region is coupled to Vdd and a heavily doped P+ region in an N well is electrically coupled to the heavily doped N+ region in an adjacent N well. The second well region comprises a P well abutting an N well. A heavily doped P+ region and a heavily doped N+ region are disposed in the P well. The heavily doped N+ region in the P well is electrically coupled to the heavily doped P+ region of the adjacent N well in common with an I/O circuit, and the heavily doped P+ region is coupled to Vss.

7 Claims, 4 Drawing Sheets

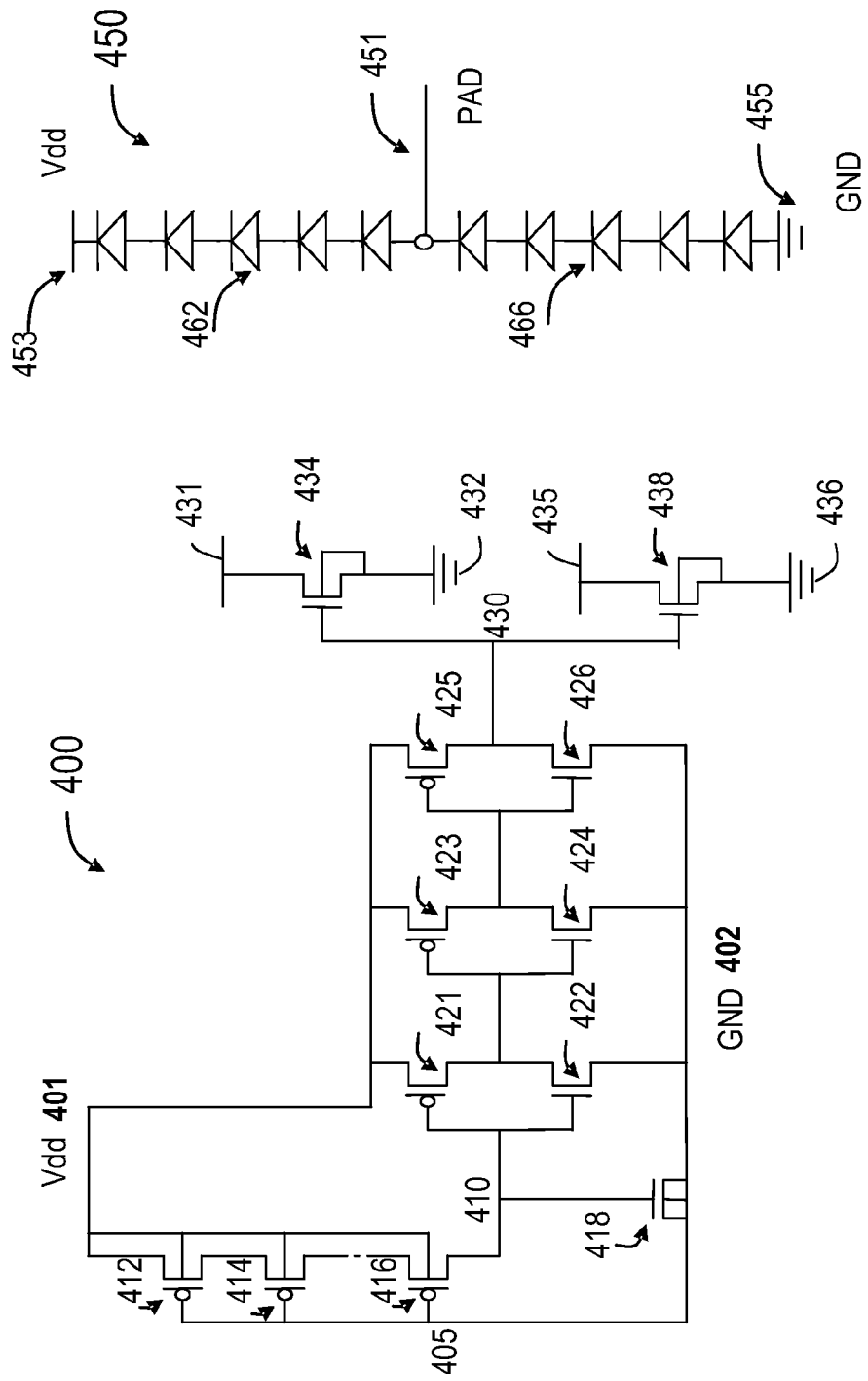

DEVICE AND METHODS FOR
ELECTROSTATIC DISCHARGE
PROTECTION

CROSS-REFERENCES TO RELATED
APPLICATIONS

This application claims priority to Chinese Application No. 201010144264.6, filed Apr. 2, 2010, commonly assigned and incorporated hereby by reference for all purposes.

BACKGROUND OF THE INVENTION

Embodiments of the present invention are directed to integrated circuits and their processing for the manufacture of semiconductor devices. More particularly, embodiments of the invention provide methods and structures for electrostatic discharge (ESD) protection. Merely by way of example, an embodiment has been applied to the manufacture of high frequency input/output of integrated circuit devices, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

For example, as device size becomes smaller, devices are typically more susceptible to harmful electrostatic discharges. Thus, conventional ESD protection circuits are employed to divert power surges away from susceptible devices to ground. However, with high signal frequencies of input/output interconnects, signal integrity cannot be preserved if the capacitance of an ESD protective device is too high. These and other limitations may be found throughout the present specification and more particularly below.

From the above, it is seen that an improved technique for ESD protection is desired.

BRIEF SUMMARY OF THE INVENTION

According to embodiments of the present invention, techniques directed to integrated circuits for the manufacturing of semiconductor devices are provided. More particularly, embodiments of the invention provides a method and a resulting device for a low capacitance electrostatic discharge (ESD) protective circuit structure. Merely by way of example, an ESD protective circuit structure has been applied to a high frequency input/out circuit. But it would be recognized that the invention has a broader range of applicability.

A specific embodiment of the invention provides an electrostatic discharge (ESD) protection circuit and a resulting device structure that has a low capacitance. A semiconductor substrate is provided. As merely an example, a P type substrate is provided. The ESD protective device comprises a first N well region provided in the semiconductor substrate, the first N well region comprises of a first heavily doped P+ region and a first heavily doped N+ region. The first heavily doped N+ region is coupled to a Vdd potential of an internal circuit. A first spacing is disposed between the first heavily doped P+ region and the first heavily doped N+ region, the spacing being a portion of the first N well region. A second N well region is provided in the semiconductor substrate. The second N well region comprises a second heavily doped P+ region and a second heavily doped N+ region, that are separated by a second spacing; the second spacing is a portion of the second N well region. The ESD protective device structure also comprises a plurality of third N well regions, wherein one of the plurality of third N well regions is disposed between the first and second N well regions, and each of the plurality of third N well regions is spaced apart from an adjacent third N well region including the first and second N well regions at a spacing length, the spacing length being a portion of the semiconductor substrate. Each one of the plurality of third N well regions comprises a third heavily doped P+ region and a third heavily doped N+ region that are separated by a third spacing, the third spacing is a portion of the third N well region. The third heavily doped P+ region is electrically coupled to the second heavily doped N+ region, and the third heavily doped N+ region is electrically coupled to the first heavily doped P+ region. A P well region is provided in the semiconductor substrate abutting the second N well region. The P well region comprises a fourth heavily doped P+ region and a fourth heavily doped N+ region. The fourth heavily doped P+ region is coupled to a Vss potential of an internal circuit. The fourth heavily doped N+ region is coupled to the second heavily doped P+ region in common with an input/output pad of an internal integrated circuit. The P well region also comprises a fourth spacing between the fourth heavily doped P+ region and the fourth heavily doped N+ region, the fourth spacing being a portion of the P well region. In a specific embodiment, a capacitance of the electrostatic discharge protective device is less than 0.03 pF.

Another embodiment of the present invention provides an alternative device structure for an electrostatic discharge (ESD) device that has low capacitance. A semiconductor substrate is provided. A first region and a second region are provided in the semiconductor substrate. A spacing is provided between the first region and the second region, the spacing being a portion of the semiconductor substrate. A first N well region is provided in the first region, the first N well region comprises a first heavily doped P+ region and a first heavily doped N+ region. The first heavily doped N+ region is coupled to a Vdd potential of an internal circuit. The ESD protective device comprises a first spacing between the first heavily doped P+ region and the first heavily doped N+ region, the first spacing being a portion of the first N well region. The ESD protective device also includes a second N well region provided in the first region, the second N well region comprises a second heavily doped P+ region and a second heavily doped N+ region, that are separated by a second spacing, the second spacing is a portion of the second N well region. The ESD protective device also comprises a plurality of third well regions, wherein one of the plurality of third N well regions is disposed between the first and second N well regions, and each of the plurality of third N well regions is spaced apart from an adjacent third well region including the first and second N well regions at a spacing length, the spacing length being a portion of the first region. Each one of the plurality of third N well regions comprises a third heavily doped N+ region and a third heavily doped P+ region, that are separated by a third spacing, the third spacing being a portion of the third N well region. The third heavily doped N+ region is electrically coupled to the first P+ region, and the third heavily doped P+ region is electrically coupled to the second N+ region. The electrostatic discharge protective device further comprises a fourth N well region that is provided in the second region. The fourth N well region comprises a fourth heavily doped N+ region that is electrically coupled to the second heavily doped P+ region in common with an input/output pad of an internal circuit. A P well region is provided in the second region abutting the fourth N well region, the P well region comprises a fourth heavily doped P+ region, the fourth heavily doped P+ region being coupled to a Vss potential of an internal circuit. In a specific embodiment, a capacitance of the electrostatic discharge (ESD) protective device is less than 0.1 pF.

In another embodiment, an electrostatic discharge protective device includes a first terminal for coupling to a contact pad of an integrated circuit, a second terminal for coupling to a power supp of the integrated circuit, and a third terminal for coupling to a electrical ground of the integrated circuit. A first plurality of diode devices are serially coupled between the first terminal and the second terminal. The first plurality of diode devices are configured to be reverse biased. A second plurality of diode devices are serially coupled between the first terminal and the third terminal. The second plurality of diode devices are configured to be reverse biased. In an embodiment, a capacitance between the first and second terminals is configured to be smaller than 0.1 pF. In another embodiment, a capacitance between the first and the third terminals is configured to be smaller than 0.1 pF.

Embodiments of the present invention provide many benefits over conventional techniques. For example, embodiments of the present invention provide an ESD protective device that has low capacitance. Additionally, techniques for providing ESD protection according to embodiments of the present invention are compatible to conventional process technology without substantial modification to conventional equipment and processes. Depending on the embodiment, one or more of the benefits may be achieved. These and other benefits will be described in more detail throughout the present specification and more particularly below.

Various additional embodiments, features and advantages of the present invention can be more fully appreciated with reference to the detailed description and accompanying drawings that follow.

BRIEF DESCRIPTION OF THE DRAWINGS

FIGS. 4A and 4B are simplified schematic diagrams illustrating an electrostatic discharge (ESD) trigger circuit and an ESD device having serial diodes according to an embodiment of the present invention.

DETAILED DESCRIPTION OF THE INVENTION

Embodiments of the present invention provide techniques directed to integrated circuits. More particularly, embodiments of the invention provide a device structure for an electrostatic discharge (ESD) protection device. Merely by way of example, an embodiment has been applied to high frequency input/output (IO) circuit devices. But it would be recognized that the present invention has a much broader range of applicability. It will be appreciated that for simplicity and clarity of illustration, elements shown in the Figures have not necessarily been drawn to scale. For example, the dimensions of some of the elements are exaggerated relative to each other for clarity.

Figure 1:
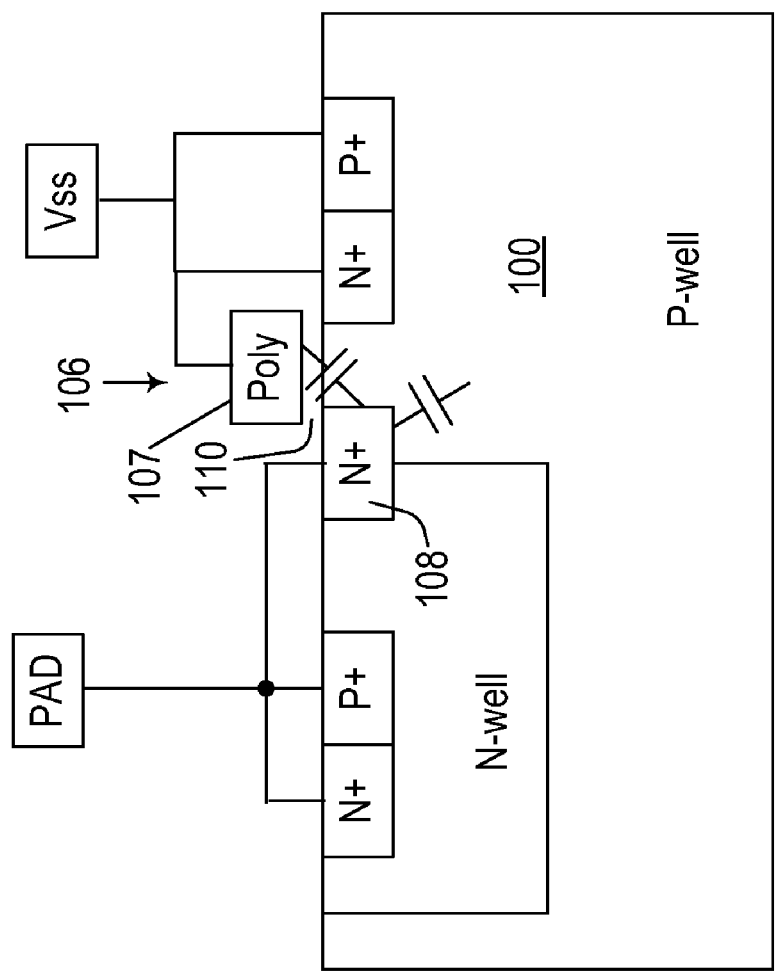
FIG. 1 is a simplified diagram illustrating a conventional ESD integrated circuit.

FIG. 1 is a simplified diagram of a conventional ESD protective device. A low voltage trigger silicon controlled rectifier (LVTSCR) as implemented in a P-type substrate 100 is shown. The ESD protective device is arranged in between an input/output buffering pad and a VSS terminal of an integrated circuit device. Included in the ESD protective device, an NMOS transistor 106 is fabricated using a polysilicon gate 107, a first heavily N+ doped region 108 and a second heavily N+ doped region 109. The gate for the NMOS transistor is formed over a thin gate oxide 110 in an area between the first heavily doped N+ region and the second heavily doped N+ region. The polysilicon gate is coupled to the VSS terminal of an integrated circuit device. Certain limitations exist for the conventional ESD protective device in application of high frequency devices. As shown in FIG. 1, the overall capacitance as a result of the parasitic junction capacitance between N+ region 108 and the NMOS capacitance between poly gate 107 and N+ region 108 cannot be reduced to less than 0.1 pF as required in high frequency input/outputs. With high signal frequencies, such ESD protective device capacitance characteristics would distort the signal beyond detection.

Figure 2:
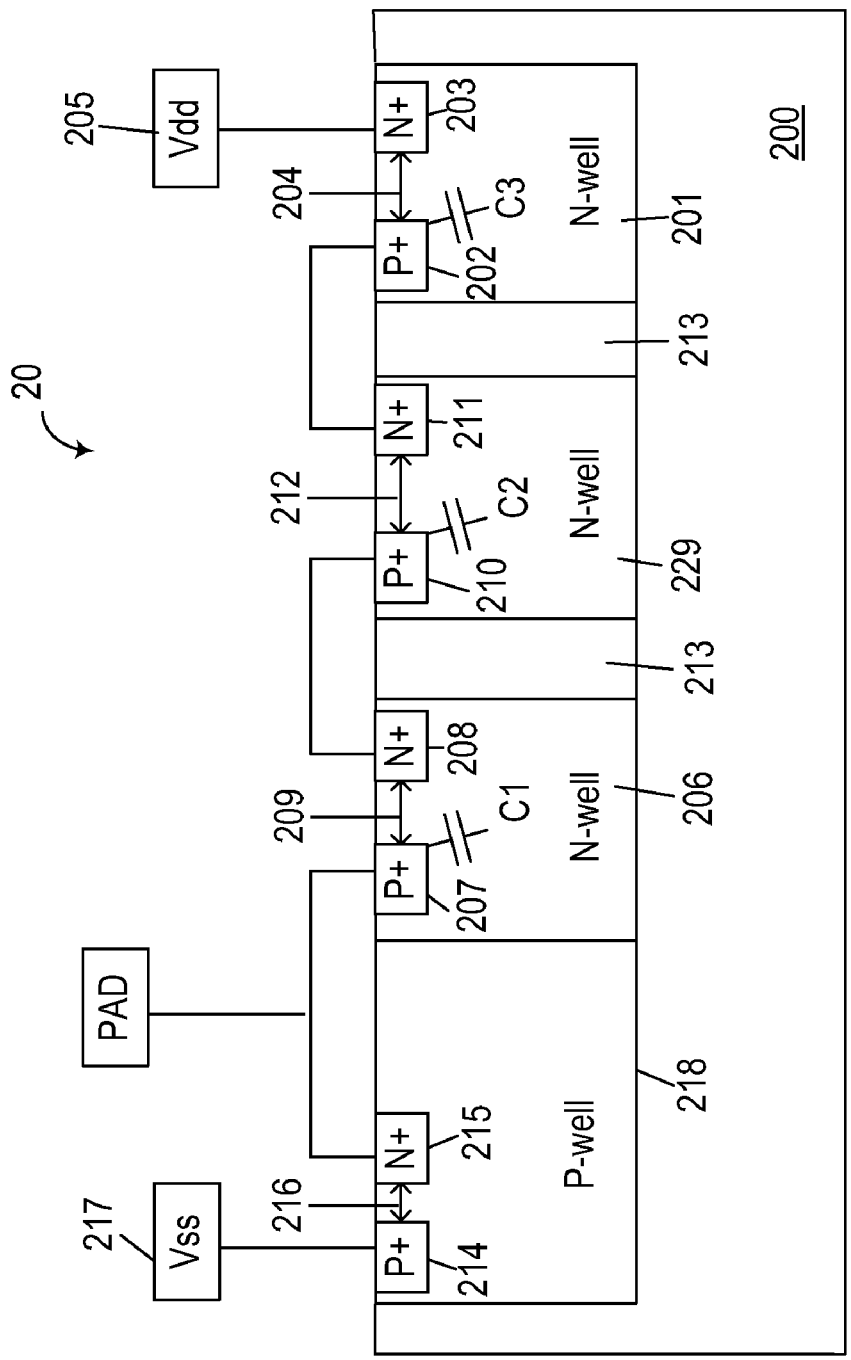
FIG. 2 is a simplified cross-section diagram illustrating an ESD protection device according to an embodiment of the present invention.

FIG. 2 is a simplified cross-section diagram illustrating an ESD protective device according to an embodiment of the present invention. This diagram is merely an example which should not unduly limit the scope of the claims herein. One of the ordinary skill in the art would recognize many variations, alternatives, and modification. As shown in FIG. 2, a semiconductor substrate 200 is provided. Preferably, the semiconductor substrate is a P type silicon substrate. Semiconductor substrate 200 can also be bulk silicon, an epitaxial silicon wafer or a silicon-on-insulator (SOI) wafer. Silicon wafer of various impurities can also be used. ESD protective device 20 includes a first N well region 201, a second N well region 206 and a plurality of third N well regions 229. The first N well region, the second N well region, and the plurality of third N well regions can be formed using a diffusion process or an implantation process. An N type impurity such as phosphorus, arsenic, or antimony can be can be implanted at a suitable dose and energy.

A first heavily doped P+ region 202 and a first heavily doped N+ region 203 spaced at a first length 204 are disposed in a surface region of first N well region 201. The first heavily doped N+ region is coupled to a Vdd (205) potential of an internal circuit. Second N well region 206 includes a second heavily doped P+ region 207 and a second heavily doped N+ region 208, that are disposed in a surface region of second N well region 206 and spaced at a second length 209. Of course there can be other variations, modifications, and alternatives.

A plurality of third N well regions 229 (only one is illustrated) are disposed between first N well region 201 and second N well region 206 in the semiconductor substrate 200. Each of the plurality of third N well regions is separated from an adjacent N well region, including the first N well region and the second N well region by a portion of the semiconductor substrate at a spacing length 213. Each of the plurality of third N well regions comprises a third heavily doped P+ region 210 and a third heavily doped N+ region 211 spaced at a third predetermined length 212. Each of the third heavily doped N+ region is electrically coupled to the first heavily doped P+ region in an adjacent first N well region. Each of the third heavily doped P+ region is electrically coupled to the second heavily doped N+ region in an adjacent second N well region. The first heavily P+ doped region, the second heavily doped P+ region, and the third heavily P+ region can be formed using a diffusion process or an implantation process. A P type impurity such as boron can be used at a suitable dose and at a suitable implant energy depending on the embodiment. The first heavily N+ doped region, the second heavily doped N+ region, and the third heavily doped N+ region can be formed using a diffusion process or an implantation process. An N type impurity such as arsenic, antimony, or phosphorus can be used. Each of the third heavily doped N+ regions is electrically coupled to the third heavily doped P+ region in an adjacent third N well region As shown in FIG. 2, a P well region 218 is formed abutting second N well region 206 in semiconductor substrate 200. The P well region can be formed by a diffusion process or an implantation process using a P type impurity such as boron. In a specific embodiment, the P well region is formed by an implantation process using boron at a suitable dose and a suitable implant energy. The P well region comprises a fourth heavily doped P+ region 214 coupled to a Vss potential 217 of an internal circuit and a fourth heavily doped N+ region 215 coupled to second heavily doped P+ region 207 in common with an input/output pad spaced at a fourth length 218. The fourth heavily doped P+ region can be formed by a diffusion process or an implantation process using a P type impurity such as boron. In a specific embodiment, the P well region can be formed by an implantation process using boron as an implant impurity. The fourth heavily doped N+ region can be formed by a diffusion process or an implantation process using a N type impurity such as arsenic, phosphorus, or antimony depending on the embodiment.

The ESD protective device provides static discharge path through Vdd and Vss terminals of the integrated circuit device. Of course one skilled in the art would recognize other variations, modifications, and alternatives.

The ESD protective device in accordance to present invention provides a low junction capacitance. As merely an example, assuming that a junction capacitance of PN junction to be C1, C2, C3, and C4 pF/μm² respectively as shown in FIG. 2. The total serial junction capacitance $C_{total}$ is given by:

$$\frac{1}{C_{total}} = \frac{1}{C1} + \frac{1}{C2} + \frac{1}{C3} + \frac{1}{C4} \text{ or } C_{total} = \frac{1}{4}Ci$$

where Ci is a capacitance of a PN junction.

The total serial junction capacitance for the ESD protective device with a PN junction capacitance can be about 0.001 pF/μm². In some embodiments, an junction area of 50 μm² is estimated to be about 0.025 pF, well below the requirement for a high frequency RF input/output of less than 0.1 pF.

Figure 3:
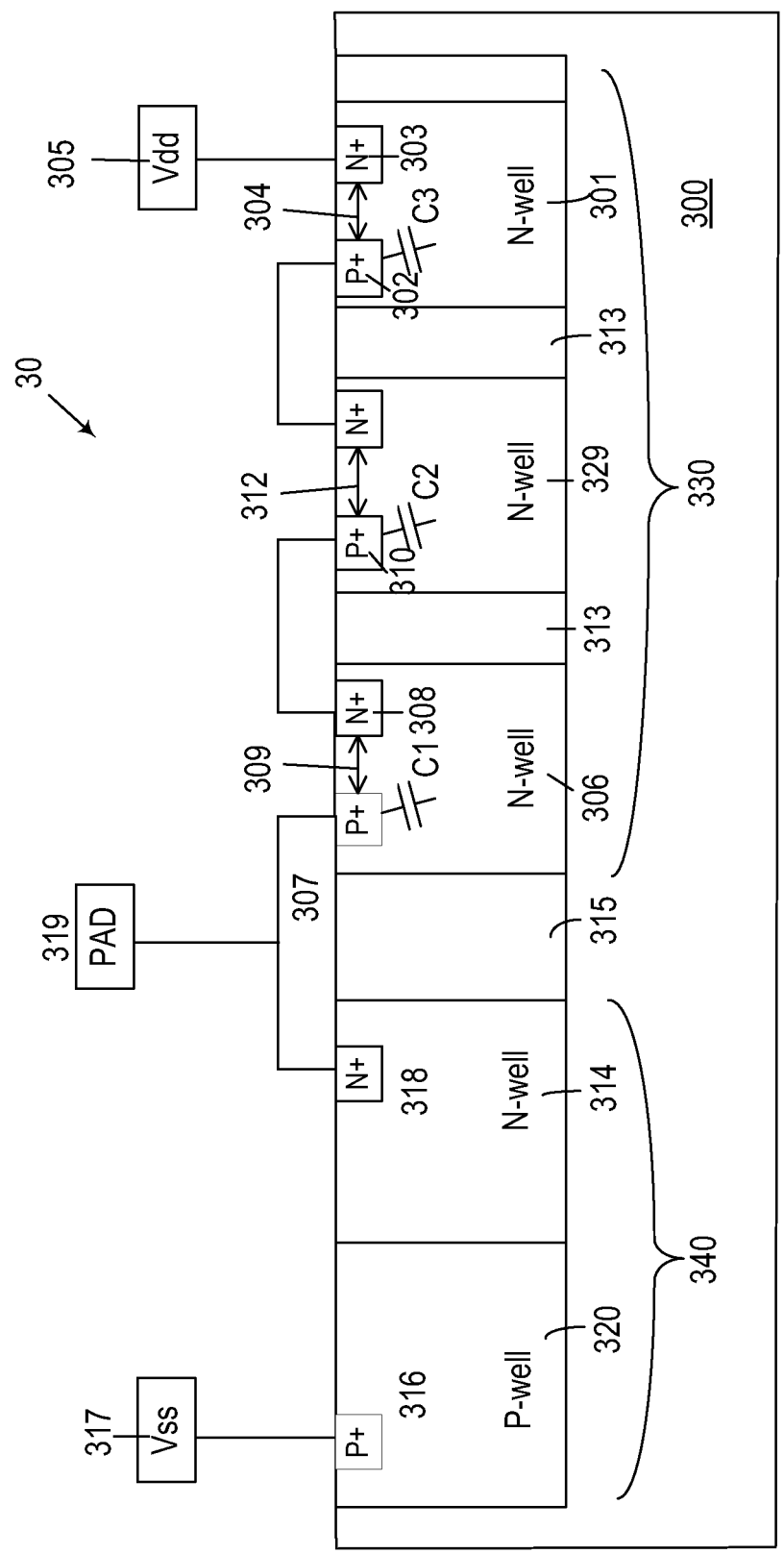
FIG. 3 is a simplified diagram illustrating an ESD protection device according to an alternative embodiment of the present invention.

FIG. 3 is a simplified diagram of an ESD protective device 30 according to an alternative embodiment of the present invention. As shown, a semiconductor substrate 300 is provided. In a preferable embodiment, the semiconductor substrate is a P type silicon substrate. Semiconductor substrate 300 can also be bulk silicon, an epitaxial silicon wafer or a silicon on insulator (SOI) wafer. Silicon wafer of a different impurity can also be used. A first region 330 and a second region 340 spaced by a portion of the semiconductor substrate at a length 315 are provided in the semiconductor substrate.

ESD protective device 30 includes a first N well region 301, a second N well region 306 and a plurality of third N well regions 329 (only one is illustrated) disposed in the first region of the semiconductor substrate. The plurality of third N well regions are disposed in between the first N well region and the second N well region. The first N well region, the second N well region, and each of the plurality of third N well regions can be formed by a diffusion process or an implantation process using a N type impurity such as arsenic, phosphorus, or antimony. Of course, the impurity dosage and implant energy depend on the application. Each of the plurality of third N well regions is separated from an adjacent third N well region, including the first N well region and the second N well region by a portion of the semiconductor substrate at a length 313.

A first heavily doped P+ region 302 and a first heavily doped N+ region 303 spaced at a first length 304 are disposed in a surface region of first N well region 301. The first heavily doped N+ region is coupled to a Vdd (305) potential of an internal circuit. A second heavily doped P+ region 307 and a second heavily doped N+ region 308 spaced at a second length 309 are disposed in a surface region of second N well region 306. A plurality of third N well regions in first region 330 comprises at least two N well regions. The plurality of third N well regions 309 (one illustrated) are disposed in between first N well region 301 and second N well region 306. Each of the plurality of third well regions comprises a third heavily doped P+ region 310 and a third heavily doped N+ region 311 spaced at a third predetermined length 312. Each of the third heavily doped N+ region is electrically coupled to the first heavily doped P+ region in an adjacent first N well region. Each of the third heavily doped P+ region is electrically coupled to the second heavily doped N+ region in an adjacent second N well region. The first heavily doped P+ region, the second heavily doped P+ region, and the third heavily doped P+ region can be formed by a diffusion process or an implantation process using a P type impurity such as boron. The first heavily doped N+ region, the second heavily doped N+ region, and the third heavily doped N+ region can be formed by a diffusion process or an implantation process using an N type impurity such as arsenic, antimony, or phosphorus. Various modifications, and alternatives would be recognized by one skilled in the art.

As shown in FIG. 3, a P well region 320 is formed abutting a fourth N well region 314 in the second region of semiconductor substrate 300. P well region 320 can be formed by a diffusion process or an implantation process using a P type impurity such as boron implanted at a suitable dose and at a suitable energy depending on the application. The fourth N well region can be formed by a diffusion process or an implantation process using a N type impurity such as arsenic, phosphorus, or antimony provided at a suitable dose of and at a suitable energy. The P well region comprises a fourth heavily doped P+ region 316 coupled to a Vss potential 317 of an internal circuit. The fourth heavily doped P+ region can be formed by a diffusion process or an implant process using a P type impurity such as boron. Preferably, the fourth heavily doped P+ region is implanted using boron at a suitable dose and an at a suitable energy. The fourth N well region comprises a fourth heavily doped N+ region 318 which is electrically coupled to second heavily doped P+ region 307. The fourth heavily doped N+ region 318 and the second heavily doped P+ region 307 are coupled with an input/output pad 319. The fourth heavily doped N+ region can be formed by a diffusion process or an implantation process using a N type impurity such as arsenic, phosphorus, or antimony at a suitable dose of and at a suitable energy. The ESD protective device provides discharge path for a positive voltage surge through a Vdd terminal and provides for a negative voltage surge through a Vss terminal of an integrated circuit. Of course, there can be other variations, modifications, and alternatives.

FIGS. 4A and 4B are simplified schematic diagrams illustrating an electrostatic discharge (ESD) trigger circuit 400 and an ESD device having serial diodes 450 according to an embodiment of the present invention. This diagram is merely an example which should not unduly limit the scope of the claims herein. One of the ordinary skill in the art would recognize many variations, alternatives, and modification.

As shown in FIG. 4A, ESD trigger circuit 400 has PMOS transistors 412, 414, and 416 connected in series between a Vdd node 401 and circuit node 410. The gates of the serially connected PMOS transistors are connected together via node 405. NMOS transistor 418 is connected in a capacitor configuration between node 410 and a ground node 402. Node 410 is connected to a CMOS pair, PMOS 421 and NMOS 422, which, in turn are connected in series to two more CMOS pairs, PMOS 423 and NMOS 424, and PMOS 425 and NMOS 426. The output of the last CMOS pair is connected to circuit noted 430.

Additionally, in ESD trigger circuit 400, NMOS transistors 434 and 438 are connected to circuit node 430. NMOS transistor 434 is connected between Vdd node 431 and ground node 432, which may or may not be the same as Vdd and ground noted 401 and 402, respectively. Similarly, NMOS transistor 438 is connected between Vdd node 435 and ground node 436, which may or may not be the same as Vdd 401 and ground 402, respectively.

In an embodiment, ESD trigger circuit 400 is configured to provide ESD protection with a low capacitance. As discussed above, in high frequency applications, such as RF circuits, it is desirable to minimize capacitance in the circuit.

As shown in FIG. 4B, electrostatic discharge (ESD) protective device 450 has a first terminal 451 for coupling to a contact pad of an integrated circuit, a second terminal 453 for coupling to a power supply of the integrated circuit, and a third terminal 455 for coupling to an electrical ground of the integrated circuit. ESD Device 450 also includes a first plurality of diode devices 462, which are serially coupled between pad terminal 451 and Vdd terminal 453. ESD Device 450 also includes a second plurality of diode devices 466 serially coupled between pad terminal 451 and ground terminal 455.

As shown in FIG. 4B, the first plurality of diode devices 462 and the second plurality of diode device 466 are configured to be reverse biased. In this example of FIG. 4B, the power supply terminal is shown to be at a higher potential than the pad terminal, and the ground terminal is shown to be at a lower potential than the pad terminal. Therefore, the cathodes and anodes of the diode devices are shown to be in the opposite direction of current flow. If the polarity of an ESD event is more positive than the Vdd terminal, diode devices 462 will route the current associated with the ESD event to the Vdd terminal, and if the polarity of an ESD event is more negative than the ground terminal, diode devices 466 will route the current associated with the ESD event to the ground terminal.

In some embodiments, ESD device 450 provides a low capacitance, which is advantageous in applications such as in RF circuits. In an embodiment, a capacitance between the pad terminal and the Vdd terminal is configured to be smaller than 0.1 pF. In another embodiment, a capacitance between the pad terminal and the round terminal is configured to be smaller than 0.1 pF. The low capacitances can be obtained using different device structures. For example, in an embodiment, the first plurality of diode devices include one or more diode devices having a p+ region adjacent to an n-well region. In another embodiment, the first plurality of diode devices comprise two or more diode devices having a p+ region adjacent to an n-well region. In another embodiment, the second plurality of diode devices comprise one or more diode devices having an n+ region adjacent to a p-well region. In yet another embodiment, the second plurality of diode devices comprise one or more diode devices having an n-well region adjacent to a p-well region. Of course, there can be other modifications, variations, and alternatives.

It is also understood that the examples and embodiments described herein are for illustrative purpose only and that various modifications or changes in light thereof will be suggested to persons skilled in the art and are to be included within the spirit and purview of this application and the scope of the appended claims.

What is claimed is:
1. An electrostatic discharge protective device, the device comprising:
 a semiconductor substrate;
 a first N well region provided in the semiconductor substrate, the first N well region comprising:
  a first heavily doped P+ region and a first heavily doped N+ region, the first heavily doped N+ region being coupled to a Vdd potential;
  a first spacing between the first heavily doped P+ region and the first heavily doped N+ region, the first spacing being a portion of the first N well region;
 a second N well region provided in the semiconductor substrate, the second N well region comprising:
  a second heavily doped P+ region and a second heavily doped N+ region;
  a second spacing between the second heavily doped P+ region and the second heavily doped N+ region, the second spacing being a portion of the second N well region;
 a plurality of third N well regions, each of the plurality of third N well regions being disposed between the first and second N well regions at a spacing and comprising:
  a third heavily doped P+ region and a third heavily doped N+ region, the third heavily doped N+ region being electrically coupled to the first heavily doped P+ region, and the third heavily doped P+ region being electrically coupled to the second heavily doped N+ region;
  a third spacing between the third heavily doped P+ region and the third heavily doped N+ region, the third spacing being a portion of the third N well region; and
 a P well region provided in the semiconductor substrate abutting the second N well region; the P well region comprises:
  a fourth heavily doped P+ region and a fourth heavily doped N+ region, the fourth heavily doped P+ region being coupled to a Vss potential, the fourth heavily doped N+ region being coupled to the second heavily doped P+ region in common with an input/output pad of an integrated circuit;

a fourth spacing between the fourth heavily doped P+ region and the fourth heavily doped N+ region, the fourth spacing being a portion of the P well region;

wherein a capacitance between the input/output pad and the first heavily doped N+ region or between the input/output pad and the fourth heavily doped P+ region is less than 0.1 pF.

2. The device of claim 1 wherein the plurality of third N well regions comprises at least two N well regions.

3. The device of claim 1 wherein the first N well region, the second N well region, and the plurality of third well regions are implanted using arsenic.

4. The device of claim 1 wherein the first heavily doped P+ region, the second heavily doped P+ region, and the third P+ region are implanted using boron.

5. The device of claim 1 wherein the first heavily doped N+ region, the second heavily doped N+ region, and the third heavily doped N+ region are implanted using arsenic.

6. The device of claim 1 wherein the first heavily doped N+ region and the second heavily doped N+ region are formed by ion implantation process using arsenic.

7. The device of claim 1 wherein the first heavily doped P+ region and the second heavily doped P+ region are formed by ion implantation process using boron as an impurity.

* * * * *